United States Patent
Lee et al.

(10) Patent No.: US 7,446,609 B2
(45) Date of Patent: Nov. 4, 2008

(54) VARIABLE GAIN AMPLIFIER WITH GAIN ADJUSTING CIRCUIT

(75) Inventors: Wen-Chang Lee, Hsin-Tien (TW); Ying-Che Tseng, Hsin-Tien (TW)

(73) Assignee: Via Technologies, Inc., Taipei (TW)

( * ) Notice: Subject to any disclaimer, the term of this patent is extended or adjusted under 35 U.S.C. 154(b) by 126 days.

(21) Appl. No.: 11/707,892

(22) Filed: Feb. 2, 2007

(65) Prior Publication Data

US 2007/0262818 A1    Nov. 15, 2007

Related U.S. Application Data

(60) Provisional application No. 60/799,324, filed on May 11, 2006.

(51) Int. Cl.
*H03F 3/45* (2006.01)
(52) U.S. Cl. ...................................... 330/254
(58) Field of Classification Search ................ 330/254, 330/129, 278; 455/232.1, 241.1
See application file for complete search history.

(56) References Cited

U.S. PATENT DOCUMENTS

| 7,065,334 B1 * | 6/2006 | Otaka et al. ............... 455/232.1 |
| 7,342,451 B2 * | 3/2008 | Brueske ...................... 330/254 |

* cited by examiner

*Primary Examiner*—Robert Pascal
*Assistant Examiner*—Hieu P Nguyen
(74) *Attorney, Agent, or Firm*—Birch, Stewart, Kolasch & Birch, LLP

(57) ABSTRACT

A variable gain amplifier includes an amplifying circuit and a gain adjusting circuit including the following circuits. A linear exponential transforming circuit transforms a linear controlling signal to output an exponential controlling signal. A voltage buffer circuit is coupled with the linear exponential transforming circuit to receive the exponential controlling signal, outputs a feedback signal to a power transforming circuit, and outputs a voltage controlling signal to control a gain of the amplifying circuit according to the exponential controlling signal and a bias current. A power transforming circuit is coupled with the linear exponential transforming circuit and the voltage buffer circuit to receive the exponential controlling signal and the feedback signal and take two times of a square root of a product of the exponential controlling signal and the feedback signal plus the bias current to output a power signal to the linear exponential transforming circuit.

18 Claims, 7 Drawing Sheets

VARIABLE GAIN AMPLIFIER WITH GAIN ADJUSTING CIRCUIT

This Non-provisional application claims priority under 35 U.S.C. § 119(e) on U.S. Provisional Application No(s). 60/799,324 filed on May 11, 2006, the entire contents of which are hereby incorporated by reference.

BACKGROUND OF THE INVENTION

1. Field of Invention

The invention relates to a variable gain amplifier with a gain adjusting circuit, and, in particular, to a variable gain amplifier, which has a gain adjusting circuit and is applied to a complementary metal-oxide semiconductor.

2. Related Art

With the advancement in communication technology, wireless communication has been widely used in various electronic products. Now, communication systems have entered a third generation of mobile communications (Wideband Code Division Multiple Access, hereinafter referred to as WCDMA), such that the demands on communication quality have further increased. Furthermore, the internal circuits in the WCDMA communication systems need amplifiers, and the quality of the amplifier directly influences the communication quality.

A variable gain amplifier (VGA) will be hereinafter referred to as an amplifier. Gain is an important factor of an amplifier. Referring to FIG. 1, a conventional amplifier 1 includes an exponential current transforming circuit 11, a voltage buffer circuit 12 and an amplifying circuit 13. The voltage buffer circuit 12 is coupled with the exponential current transforming circuit 11 and the amplifying circuit 13. In addition, the amplifier 1 operates as follows. The exponential current transforming circuit 11 receives a current control signal Icl from an outside source, transforms the current control signal Icl into a current output signal Io and outputs the current output signal Io to the voltage buffer circuit 12. The voltage buffer circuit 12 outputs a voltage controlling signal Vcl to the amplifying circuit 13 according to the current output signal Io. After the amplifying circuit 13 receives an input signal INPUT from the outside, the amplifying circuit 13 applies the desired gain to the input signal INPUT, thus amplifying the input signal INPUT according to the adjustment of the voltage controlling signal Vcl and then outputting a signal OUTPUT.

Usually, the amplifying circuit 13 of the amplifier 1 is implemented by BJT transistors. However, the manufacturing processes of BJT transistors are more expensive, and are not easily compatible with the complementary metal-oxide semiconductor (CMOS) processes. Therefore, BJT transistors are gradually being replaced with MOS transistors. Referring to FIG. 2, an amplifier 2 implemented using the MOS transistors includes an exponential current transforming circuit 21, a voltage buffer circuit 22 and an amplifying circuit 23, and the operations thereof are the same as those of the amplifier 1 in FIG. 1. When the MOS transistors of the exponential current transforming circuit 21 work in sub-threshold regions, the same effects as those in the amplifying circuit 13 using the BJT transistors may be achieved. At this time, the transistors Q1 and Q2 of the voltage buffer circuit 22 work in saturation regions, and the current gain G is:

$$G = \left\{ \frac{1}{1+2\frac{\sqrt{I1 I2}}{IB}} \right\}^{\frac{1}{2}} * \exp\left(\frac{-R1 * Icl}{2nV_T}\right).$$

If the transistor Q1 works in the sub-threshold region and the transistor Q2 works in the saturation region, the current gain G becomes:

$$G = \left\{ \frac{\sqrt{IB}}{2nV_T\sqrt{\beta}} \right\} * \exp\left(\frac{-R1 * Icl}{nV_T}\right).$$

Wherein, G is the current gain, IB is a bias current, I1 and I2 are the currents respectively flowing through the transistors Q1 and Q2, R1 is the resistance, Icl is the current control signal, and $V_T$ is the threshold voltage.

Due to the demand on the specification of the WCDMA communication system, the current gain G needs to be exponentially linear when amplifiers composed of MOS transistors is used. However, the obtained current gain G is exponentially non-linear in practical application no matter which regions the transistors Q1 and Q2 are operating in. For example, FIG. 3 shows the relationship between the current gain G and the current control signal Icl when the amplifier composed of the MOS transistors is being used, wherein the curve with the slope A represents the ideal current gain G when the transistors Q1 and Q2 work in the saturation region, and the curve with the slope B represents the ideal current gain G when the transistor Q1 works in the sub-threshold region and the transistor Q2 works in the saturation region. In practice, however, when the current gain G is high, the current gain G differs from the curve with the slope A by about 3 dB, as shown by the solid line. In order to compensate for the difference of 3 dB, a gain compensation circuit is usually provided to compensate for the current gain. The conventional gain compensation circuit is large and complex, greatly complicating system design.

Therefore, it is an important subject of the invention to provide a variable gain amplifier, which has a gain adjusting circuit and can solve the above-mentioned problems.

SUMMARY OF THE INVENTION

In view of the foregoing, the invention is to provide a gain adjusting circuit capable of obtaining an exponentially linear current gain, and a variable gain amplifier associated therewith.

To achieve the above, the invention discloses a gain adjusting circuit applied to a variable gain amplifier. The gain adjusting circuit includes a linear exponential transforming circuit, a voltage buffer circuit, and a power transforming circuit. The linear exponential transforming circuit receives a linear controlling signal and transforms the linear controlling signal to output an exponential controlling signal. The voltage buffer circuit is coupled with the linear exponential transforming circuit to receive the exponential controlling signal, and further outputs a feedback signal according to the exponential controlling signal and a bias current while outputting a voltage controlling signal to control the variable gain amplifier. The power transforming circuit is coupled with the linear exponential transforming circuit and the voltage buffer circuit to receive the exponential controlling signal and the feedback signal, and to take two times of a square root of a product of the exponential controlling signal and the feedback signal plus the bias current to output a power signal to the linear exponential transforming circuit.

To achieve the above, the invention also discloses a variable gain amplifier, which includes a gain adjusting circuit and an amplifying circuit. The gain adjusting circuit includes a linear exponential transforming circuit, a voltage buffer circuit, and a power transforming circuit. The linear exponential transforming circuit receives a linear controlling signal and transforms the linear controlling signal to output an exponential controlling signal. The voltage buffer circuit is coupled with the linear exponential transforming circuit to receive the exponential controlling signal, and further outputs a feedback signal according to the exponential controlling signal and a bias current while also outputting a voltage controlling signal. The power transforming circuit is coupled with the linear exponential transforming circuit and the voltage buffer circuit to receive the exponential controlling signal and the feedback signal. The power transforming circuit further takes two times of a square root of a product of the exponential controlling signal and the feedback signal plus the bias current to output a power signal to the linear exponential transforming circuit. The amplifying circuit receives an input signal and is coupled with the voltage buffer circuit to receive the voltage controlling signal and to adjust a gain of the amplifying circuit according to the voltage controlling signal so as to amplify the input signal.

As mentioned above, the gain adjusting circuit and the variable gain amplifier according to the invention utilize the linear exponential transforming circuit to output the exponential controlling signal to the voltage buffer circuit and the power transforming circuit, and the voltage buffer circuit outputs the feedback signal to the power transforming circuit according to the exponential controlling signal and the bias current and outputs the voltage controlling signal to control the current gain of the amplifier. In addition, the power transforming circuit takes twice the square root of the product of the exponential controlling signal and the feedback signal plus the bias current to obtain the power signal according to the exponential controlling signal, the feedback signal and the bias current. Compared with the prior art, because the power transforming circuit is included and operates in conjunction with the voltage buffer circuit and the linear exponential transforming circuit, the relationship between the linear controlling signal and the voltage controlling signal is exponential such that the relationship between the linear controlling signal and the current gain of the amplifier is linear-in-dB. Thus, the amplifier can satisfy the requirement of the specification. That is, the current gain and the linear controlling signal have the linear-in-dB relationship such that the quality of the amplifier can be greatly enhanced without any additional gain compensation circuit.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
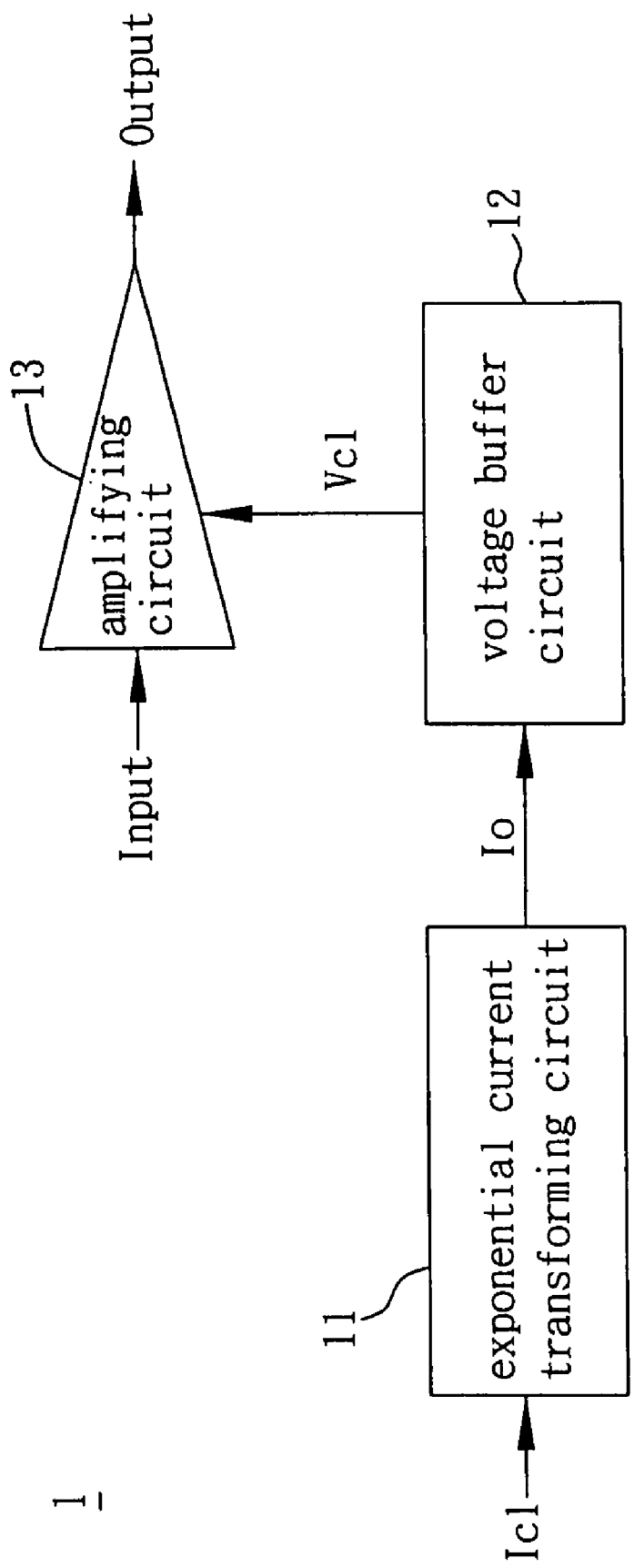
FIG. 1 is a schematic illustration showing a conventional amplifier.
Figure 2:
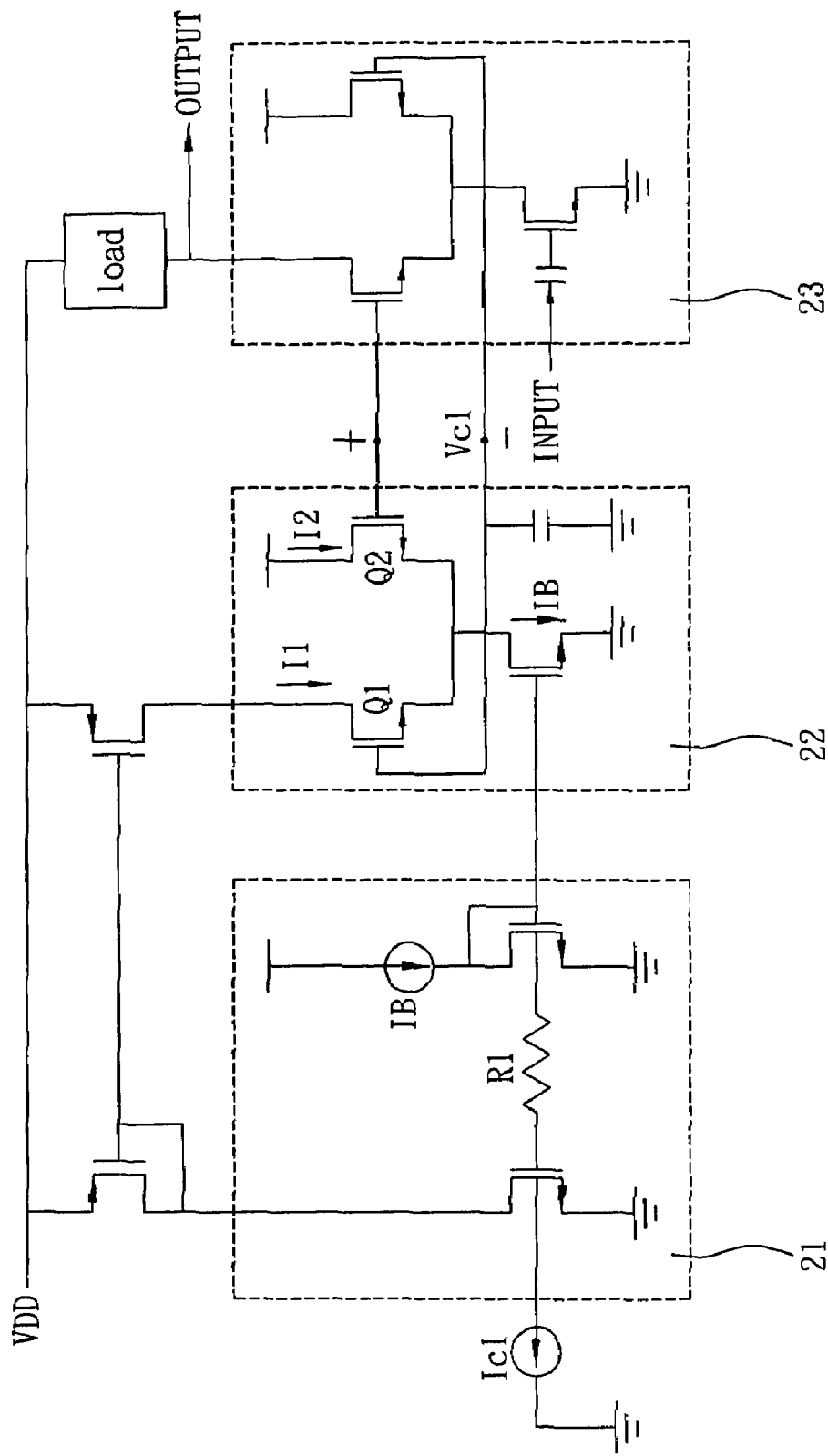
FIG. 2 is a schematic illustration showing a circuit of the conventional amplifier composed of MOS transistors.
Figure 3:
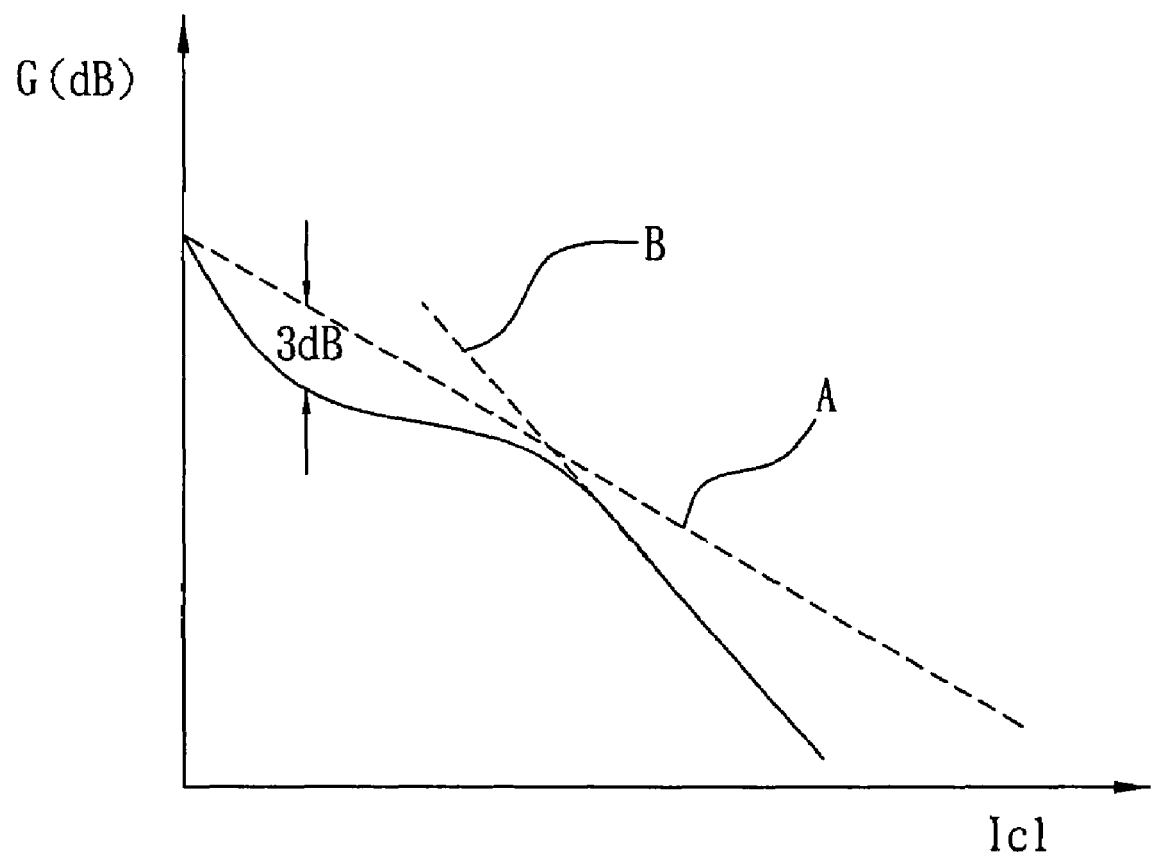
FIG. 3 is a schematic illustration showing a relationship between a current gain and a current control signal according to the prior art.
Figure 4:
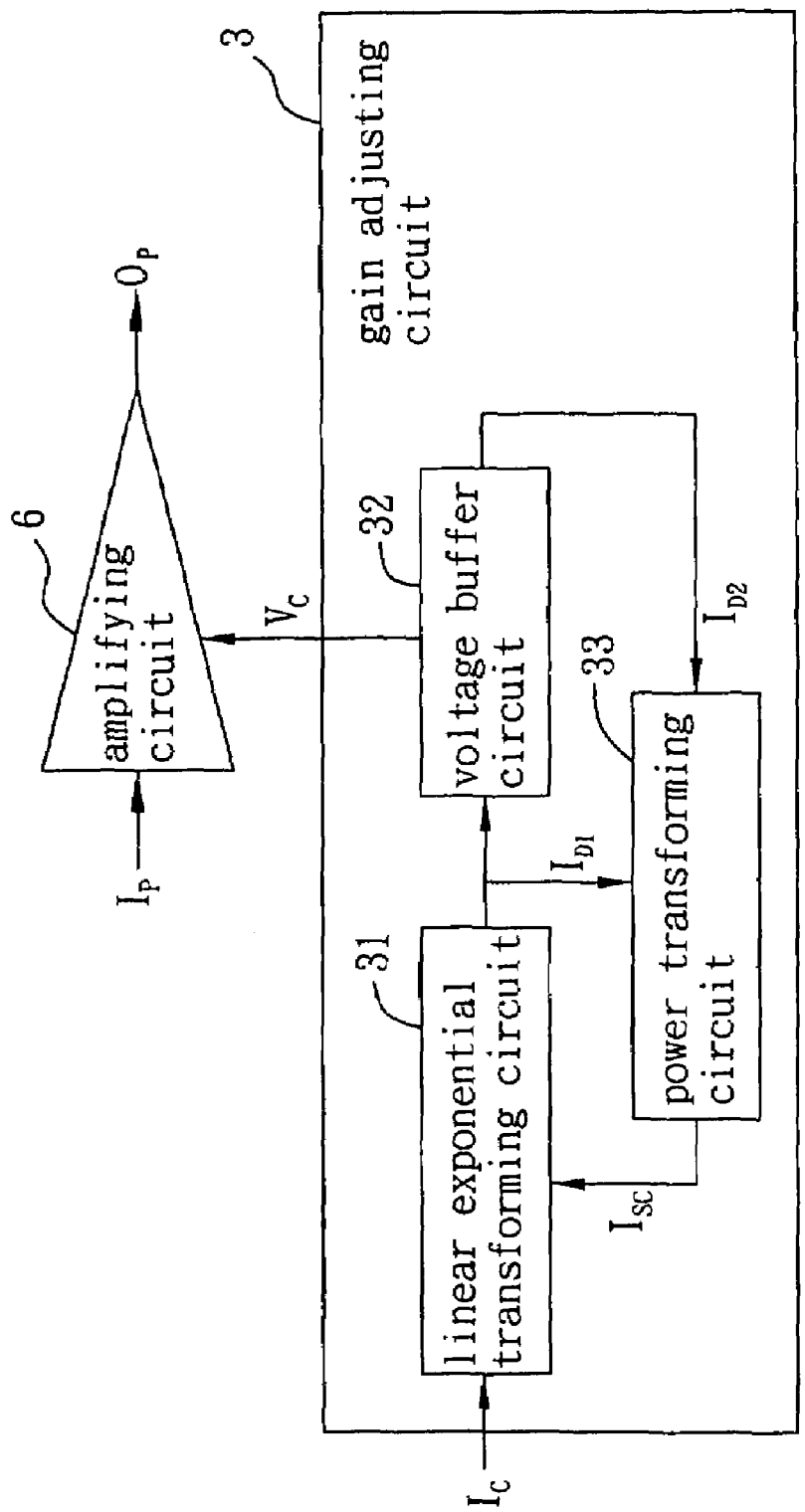
FIG. 4 is a schematic block diagram showing a gain adjusting circuit according to an embodiment of the invention.

Referring to FIG. 4, a gain adjusting circuit 3 according to the embodiment of the invention controls an amplifying circuit 6. The gain adjusting circuit 3 includes a linear exponential transforming circuit 31, a voltage buffer circuit 32 and a power transforming circuit 33.

Figure 5:
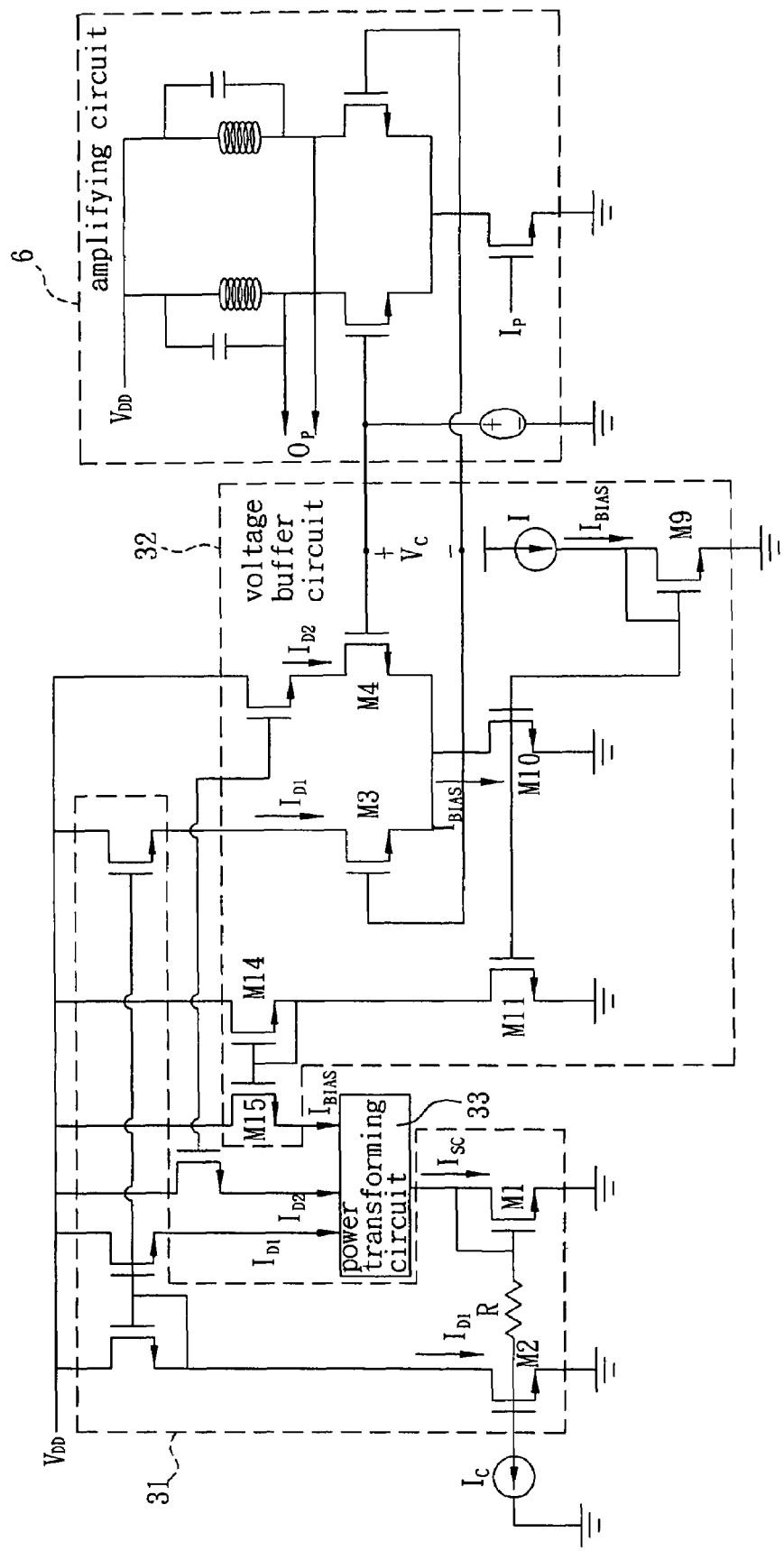
FIG. 5 is a schematic circuit diagram showing a gain adjusting circuit according to the embodiment of the invention.

FIG. 5 is a schematic circuit diagram showing the gain adjusting circuit 3 according to the embodiment of the invention. Referring to FIGS. 4 and 5, the linear exponential transforming circuit 31 includes a resistor R, a first transistor M1 and a second transistor M2. The first transistor M1 has a drain coupled with the power transforming circuit 33 to receive a power signal $I_{SC}$, and a gate coupled with one end of the resistor R and the drain of the first transistor M1. The second transistor M2 has a gate for receiving a linear controlling signal $I_C$ and coupling with the other end of the resistor R, and transforms the linear controlling signal $I_C$ to output an exponential controlling signal $I_{D1}$ from a drain of the second transistor M2. The exponential controlling signal $I_{D1}$ is duplicated and then transferred to the voltage buffer circuit 32 and the power transforming circuit 33 by way of a current mirror.

Referring again to FIGS. 4 and 5, the voltage buffer circuit 32 includes a third transistor M3 and a fourth transistor M4. A drain of the third transistor M3 is coupled with the linear exponential transforming circuit 31 to receive the exponential controlling signal $I_{D1}$, and a source of the fourth transistor M4 is coupled with a source of the third transistor M3 so that the fourth transistor M4 generates a feedback signal $I_{D2}$ at a drain of the fourth transistor M4, and a voltage controlling signal $V_c$ for controlling the amplifying circuit 6 is generated at gates of the third transistor M3 and the fourth transistor M4. In this embodiment, the third transistor M3 and the fourth transistor M4 operate in the saturation region. In addition, the voltage buffer circuit 32 further includes a current source I, a first current mirror and a second current mirror. The current source I generates a bias current $I_{BIAS}$. The first current mirror is composed of a transistor M9 and a transistor M10 and is coupled with the current source I to duplicate the bias current $I_{BIAS}$ and transfer the duplicated bias current $I_{BIAS}$ to the sources of the third transistor M3 and the fourth transistor M4. The second current mirror is composed of transistors M9, M11, M14 and M15, and is coupled with the current source I to duplicate the bias current $I_{BIAS}$ and transfer the duplicated bias current $I_{BIAS}$ to the power transforming circuit 33. In this embodiment, because the voltage buffer circuit 32, the first current mirror and the second current mirror have the function of stabilizing the current, the current is free from fluctuation due to the influence of the original circuit load.

Figure 6:
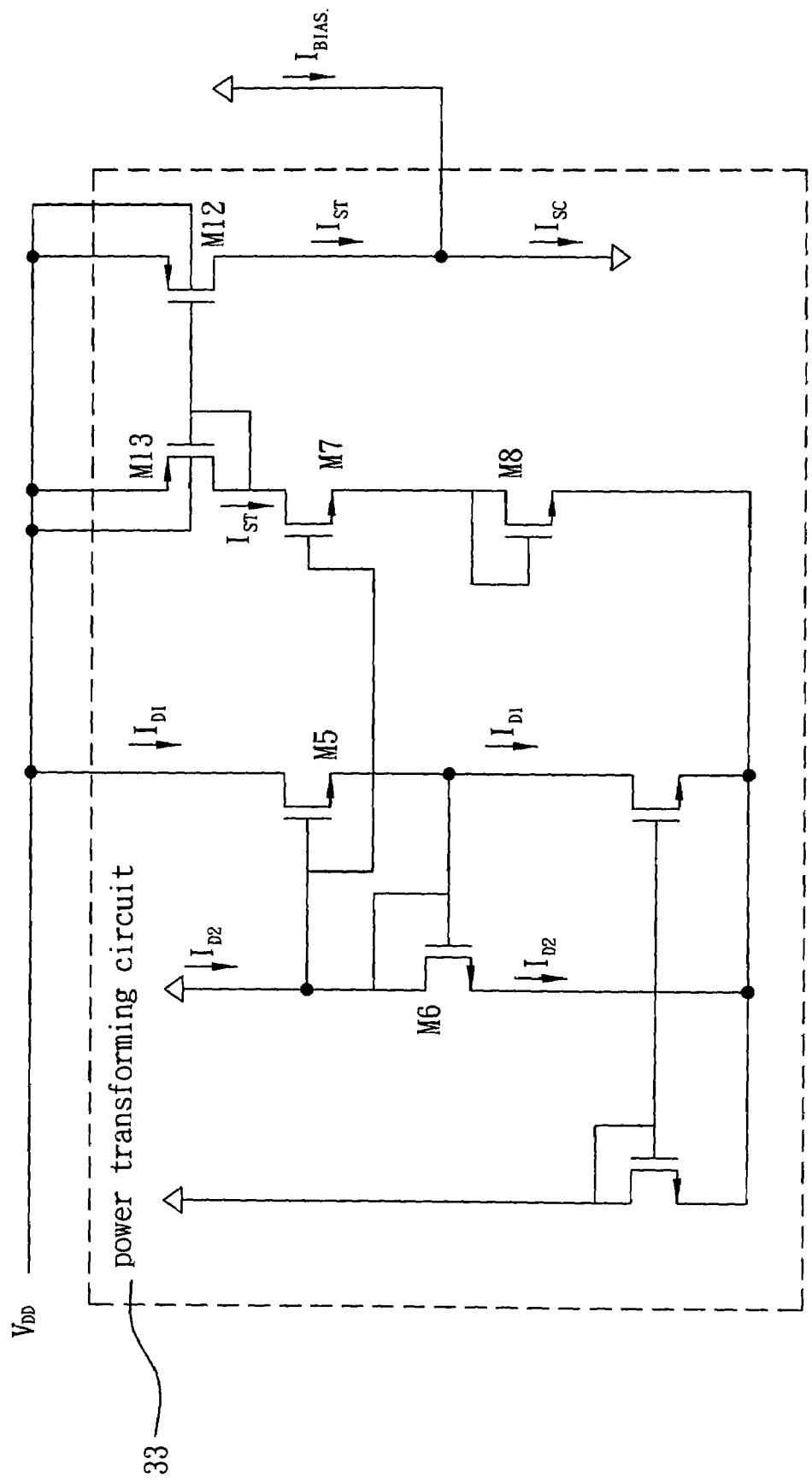
FIG. 6 is a schematic illustration showing a power transforming circuit according to the embodiment of the invention.

Referring to FIGS. 4 to 6, the power transforming circuit 33 includes a fifth transistor M5, a sixth transistor M6, a seventh transistor M7, an eighth transistor M8 and a third current mirror. A drain of the sixth transistor M6 is coupled with a gate of the fifth transistor M5. A gate of the sixth transistor M6 is coupled with a source of the fifth transistor M5, wherein the exponential controlling signal $I_{D1}$ and the feedback signal $I_{D2}$ are respectively inputted to a drain of the fifth transistor M5 and the drain of the sixth transistor M6, or the exponential controlling signal $I_{D1}$ and the feedback signal $I_{D2}$ may also be respectively inputted to the drain of the sixth transistor M6 and the drain of the fifth transistor M5 (not shown). A gate of the seventh transistor M7 is coupled with the gate of the fifth transistor M5. A drain of the eighth transistor M8 is coupled with a gate of the eighth transistor M8 and a source of the seventh transistor M7 so that the eighth transistor M8 generates a power transforming signal $I_{ST}$. The third current mirror is composed of a transistor M12 and a transistor M13, and the third current mirror is coupled with the seventh transistor M7 to duplicate the power transforming signal $I_{ST}$. The power transforming signal $I_{ST}$, the exponential controlling signal $I_{D1}$ and the feedback signal $I_{D2}$ have the following relationship:

$$I_{ST}=2\sqrt{I_{D1}*I_{D2}}.$$

The third current mirror is coupled with the second current mirror in order to add the duplicated power transforming signal $I_{ST}$ and the bias current $I_{BIAS}$ together to generate the power signal $I_{SC}$ and to output the power signal $I_{SC}$ to the linear exponential transforming circuit 31. The power signal $I_{SC}$, the power transforming signal $I_{ST}$ and the bias current $I_{BIAS}$ have the following relationship:

$$I_{SC}=I_{BIAS}+2\sqrt{I_{D1}*I_{D2}}.$$

In addition, the fifth transistor M5, the sixth transistor M6, the seventh transistor M7 and the eighth transistor M8 of this embodiment operate in the sub-threshold regions.

As shown in FIGS. 4 and 5, the gain adjusting circuit 3 of this embodiment operates as follows. The linear exponential transforming circuit 31 receives the linear controlling signal $I_C$, transforms the linear controlling signal $I_C$ to output the exponential controlling signal $I_{D1}$, and transfers the exponential controlling signal $I_{D1}$ to the voltage buffer circuit 32 and the power transforming circuit 33. Throughout, the transistors in the voltage buffer circuit 32 operate in the saturation region, and the voltage buffer circuit 32 receives the exponential controlling signal $I_{D1}$, generates the feedback signal $I_{D2}$ according to the exponential controlling signal $I_{D1}$ and the bias current $I_{BIAS}$ in the voltage buffer circuit 32, and inputs the feedback signal $I_{D2}$ to the power transforming circuit 33. When the feedback signal $I_{D2}$ is being generated, the voltage buffer circuit 32 also generates the voltage controlling signal $V_C$ to control a current gain Gi of the amplifying circuit 6. Thus, after receiving an input signal $I_P$ from the outside, the amplifying circuit 6 adjusts and amplifies the input signal $I_P$ into an output signal $O_P$, to be outputted, according to the voltage controlling signal $V_C$. The power transforming circuit 33 receives the exponential controlling signal $I_{D1}$, the feedback signal $I_{D2}$ and the bias current $I_{BIAS}$ in the voltage buffer circuit 32, and takes twice the square root of the product of the exponential controlling signal $I_{D1}$, and the feedback signal $I_{D2}$ plus the bias current $I_{BIAS}$ to obtain the power signal $I_{SC}$. Then, the power transforming circuit 33 transfers the power signal $I_{SC}$ to the linear exponential transforming circuit 31. Throughout, the transistors in the power transforming circuit 33 operate in the sub-threshold regions.

When the linear exponential transforming circuit 31 receives the power signal $I_{SC}$, the power signal $I_{SC}$ and the exponential controlling signal $I_{D1}$ have the following relationship:

$$\frac{I_{D1}}{I_{SC}}=\frac{I_{D1}}{I_{BIAS}+2\sqrt{I_{D1}I_{D2}}}=\exp\frac{I_C R}{V_T}.$$

Wherein, $I_{D1}$ is the exponential controlling signal, $I_{D2}$ is the feedback signal, $I_{SC}$ is the power signal, $I_C$ is the linear controlling signal, R is the resistance, $I_{BIAS}$ is the bias current and $V_T$ is the threshold voltage.

The relationship between the exponential controlling signal $I_{D1}$ and the linear controlling signal $I_C$ is exponential, and the voltage controlling signal $V_C$ is changed with the influence of the exponential controlling signal $I_{D1}$, so the voltage controlling signal $V_C$ and the linear controlling signal $I_C$ have the exponential relationship. The current gain Gi generated by the amplifying circuit 6 which receives the voltage controlling signal $V_C$ is:

$$Gi=\frac{\sqrt{I_{D1}}}{\sqrt{I_{D1}}+\sqrt{I_{D2}}}.$$

Thus, the square of the current gain Gi is equal to the relationship between the power signal $I_{SC}$ and the exponential controlling signal $I_{D1}$:

$$Gi^2=\frac{I_{D1}}{I_{D1}+I_{D2}+2\sqrt{I_{D1}I_{D2}}}=\frac{I_{D1}}{I_{BIAS}+2\sqrt{I_{D1}I_{D2}}}=\frac{I_{D1}}{I_{SC}};$$

$$Gi^2=\exp\frac{I_C R}{V_T};\text{ and}$$

$$Gi=\exp\frac{I_C R}{2V_T}.$$

Wherein, Gi is the current gain, $I_{D1}$ is the exponential controlling signal, $I_{D2}$ is the feedback signal, $I_{SC}$ is the power signal, $I_C$ is the linear controlling signal, R is the resistance, $I_{BIAS}$ is the bias current and $V_T$ is the threshold voltage. According to the above-mentioned equations, the relationship between the linear controlling signal $I_C$ and the current gain Gi is linear-in-dB.

The gain adjusting circuit 3 utilizes the power transforming circuit 33 to take two times of the square root of the product of the exponential controlling signal $I_{D1}$ and the feedback signal $I_{D2}$ plus the bias current $I_{BIAS}$ to obtain the power signal $I_{SC}$, and obtains the exponential relationship between the linear controlling signal $I_C$ and the voltage controlling signal $V_C$ according to the linear exponential transforming circuit 31 and the voltage buffer circuit 32. The relationship between the linear controlling signal $I_C$ and the current-gain Gi is linear-in-dB. Thus, the post stage of the amplifying circuit 6 can meet the required specifications so as to greatly enhance the quality of the amplifying circuit 6. Thus, it is unnecessary to design a gain compensation circuit to compensate for the current gain, and the design of the amplifying circuit 6 is thus simplified.

Figure 7:
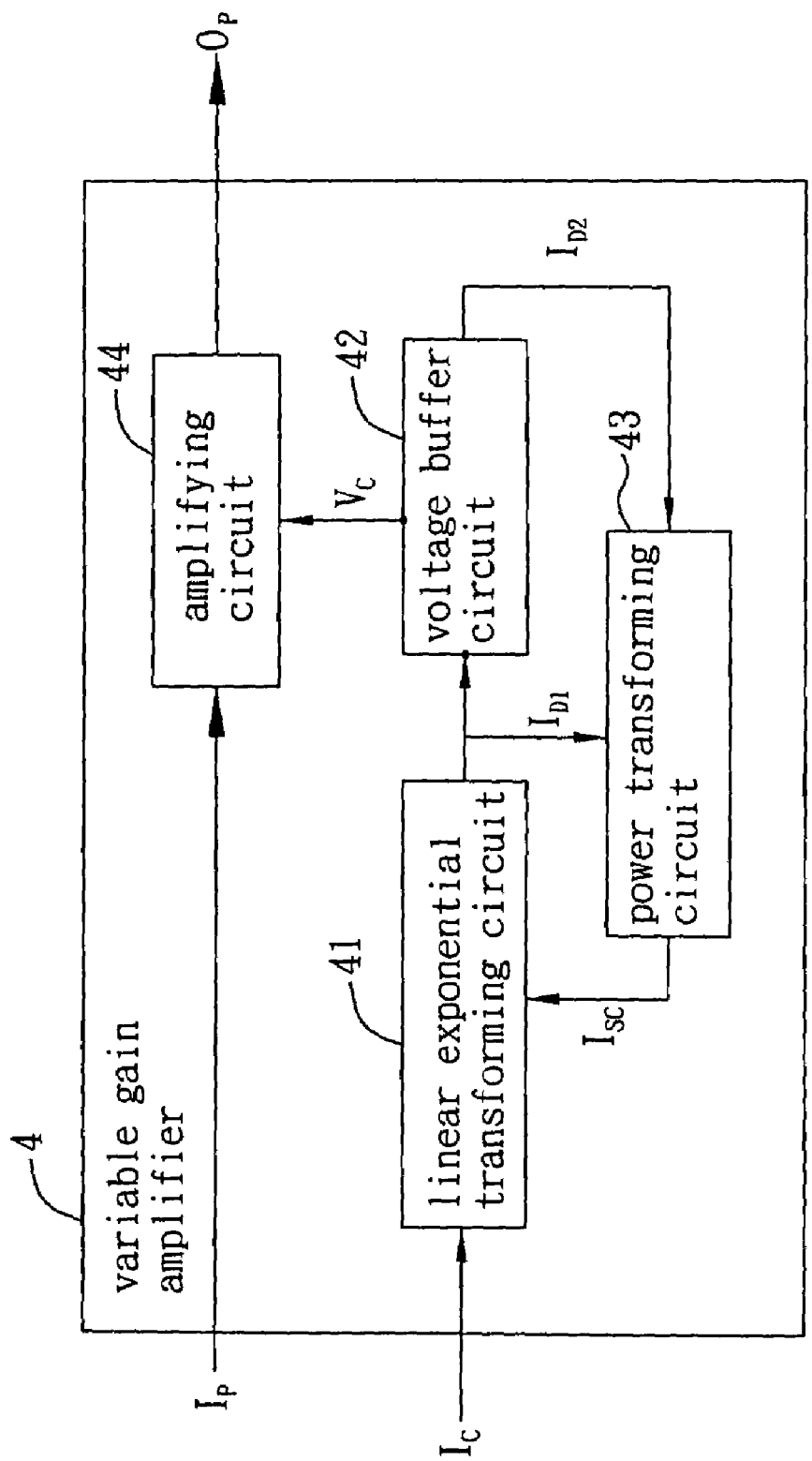
FIG. 7 is a schematic illustration showing a variable gain amplifier according to another embodiment of the invention.

Referring to FIG. 7, a variable gain amplifier 4 according to another embodiment of the invention includes a linear exponential transforming circuit 41, a voltage buffer circuit 42, a power transforming circuit 43 and an amplifying circuit 44.

The operations, features and effects of the linear exponential transforming circuit 41, the voltage buffer circuit 42 and the power transforming circuit 43 according to this embodiment are the same as those of the linear exponential transforming circuit 31, the voltage buffer circuit 32 and the power transforming circuit 33 (see FIG. 4) according to the above-mentioned embodiment, so detailed descriptions thereof will be omitted.

The amplifying circuit 44 of this embodiment receives the input signal $I_p$, is coupled with the voltage buffer circuit 42 to receive the voltage controlling signal $V_C$, and adjusts the gain of the amplifying circuit 44 according to the voltage controlling signal $V_C$ in order to amplify the input signal $I_p$ into the output signal $O_p$ to be outputted.

In summary, the gain adjusting circuit and the variable gain amplifier according to the invention utilize the linear exponential transforming circuit to output the exponential controlling signal to the voltage buffer circuit and the power transforming circuit, and the voltage buffer circuit outputs the feedback signal to the power transforming circuit according to the exponential controlling signal and the bias current and outputs the voltage controlling signal to control the current gain of the amplifier. In addition, the power transforming circuit takes twice the square root of the product of the exponential controlling signal and the feedback signal plus the bias current to obtain the power signal according to the exponential controlling signal, the feedback signal and the bias current. Compared with the prior art, because the power transforming circuit is included and operates in conjunction with the voltage buffer circuit and the linear exponential transforming circuit, the relationship between the linear controlling signal and the voltage controlling signal is exponential such that the relationship between the linear controlling signal and the current gain of the amplifier is linear-in-dB. Thus, the amplifier can satisfy the requirement of the specification. That is, the current gain and the linear controlling signal have the linear-in-db relationship such that the quality of the amplifier can be greatly enhanced without any additional gain compensation circuit.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A gain adjusting circuit applied to a variable gain amplifier, the gain adjusting circuit comprising:
   a linear exponential transforming circuit for receiving a linear controlling signal and transforming the linear controlling signal to output an exponential controlling signal;
   a voltage buffer circuit, which is coupled with the linear exponential transforming circuit to receive the exponential controlling signal, and outputs a feedback signal according to the exponential controlling signal and a bias current while outputting a voltage controlling signal to control the variable gain amplifier; and
   a power transforming circuit, which is coupled with the linear exponential transforming circuit and the voltage buffer circuit to receive the exponential controlling signal and the feedback signal, and to take two times of a square root of a product of the exponential controlling signal and the feedback signal plus the bias current to output a power signal to the linear exponential transforming circuit.

2. The gain adjusting circuit according to claim 1, wherein the linear controlling signal and the voltage controlling signal have an exponential relationship, and the linear controlling signal and a gain of the variable gain amplifier have a linear-in-dB relationship.

3. The gain adjusting circuit according to claim 1, wherein the linear exponential transforming circuit comprises:
   a resistor;
   a first transistor having a drain coupled with the power transforming circuit to receive the power signal, and a gate coupled with one end of the resistor and the drain of the first transistor; and
   a second transistor having a gate, which receives the linear controlling signal, is coupled with the other end of the resistor, and transforms the linear controlling signal to output the exponential controlling signal from a drain of the second transistor.

4. The gain adjusting circuit according to claim 1, wherein the voltage buffer circuit comprises:
   a third transistor having a drain coupled with the linear exponential transforming circuit to receive the exponential controlling signal; and
   a fourth transistor having a source coupled with a source of the third transistor to generate the feedback signal at a drain of the fourth transistor, wherein the voltage controlling signal for controlling the variable gain amplifier is generated at gates of the third transistor and the fourth transistor.

5. The gain adjusting circuit according to claim 4, wherein the third transistor and the fourth transistor operate in saturation regions.

6. The gain adjusting circuit according to claim 4, wherein the voltage buffer circuit further comprises:
   a current source for generating the bias current;
   a first current mirror, which is coupled with the current source to duplicate the bias current and transfer the duplicated bias current to the sources of the third transistor and the fourth transistor; and
   a second current mirror, which is coupled with the current source to duplicate the bias current and transfer the duplicated bias current to the power transforming circuit.

7. The gain adjusting circuit according to claim 6, wherein the power transforming circuit comprises:
   a fifth transistor;
   a sixth transistor having a drain coupled with a gate of the fifth transistor and a gate coupled with a source of the fifth transistor, wherein the exponential controlling signal and the feedback signal are respectively inputted to a drain of the fifth transistor and the drain of the sixth transistor, or the exponential controlling signal and the feedback signal are respectively inputted to the drain of the sixth transistor and the drain of the fifth transistor;
   a seventh transistor having a gate coupled with the gate of the fifth transistor;
   an eighth transistor having a drain coupled with a gate of the eighth transistor and a source of the seventh transistor to generate a power transforming signal; and
   a third current mirror, which is coupled with the seventh transistor to duplicate the power transforming signal, is coupled with the second current mirror to add the duplicated power transforming signal and the bias current together to generate the power signal, and outputs the power signal to the linear exponential transforming circuit.

8. The gain adjusting circuit according to claim 7, wherein the power transforming signal is obtained by taking two times of the square root of the product of the exponential controlling signal and the feedback signal, 9. The gain adjusting circuit according to claim 7, wherein the fifth transistor, the sixth transistor, the seventh transistor and the eighth transistor operate in sub-threshold regions.

10. A variable gain amplifier, comprising:
a gain adjusting circuit, which comprises:
a linear exponential transforming circuit for receiving a linear controlling signal and transforming the linear controlling signal to output an exponential controlling signal,
a voltage buffer circuit, which is coupled with the linear exponential transforming circuit to receive the exponential controlling signal, and outputs a feedback signal according to the exponential controlling signal and a bias current while also outputting a voltage controlling signal, and
a power transforming circuit, which is coupled with the linear exponential transforming circuit and the voltage buffer circuit to receive the exponential controlling signal and the feedback signal and take two times of a square root of a product of the exponential controlling signal and the feedback signal plus the bias current to output a power signal to the linear exponential transforming circuit; and
an amplifying circuit, which receives an input signal and is coupled with the voltage buffer circuit to receive the voltage controlling signal and to adjust a gain of the amplifying circuit according to the voltage controlling signal so as to amplify the input signal.

11. The variable gain amplifier according to claim 10, wherein the linear controlling signal and the voltage controlling signal have an exponential relationship, and the linear controlling signal and a gain of the amplifying circuit have a linear-in-dB relationship.

12. The variable gain amplifier according to claim 10, wherein the linear exponential transforming circuit comprises:
a resistor;
a first transistor having a drain coupled with the power transforming circuit to receive the power signal, and a gate coupled with one end of the resistor and the drain of the first transistor; and
a second transistor having a gate, which receives the linear controlling signal, is coupled with the other end of the resistor, and transforms the linear controlling signal to output the exponential controlling signal from a drain of the second transistor.

13. The variable gain amplifier according to claim 10, wherein the voltage buffer circuit comprises:
a third transistor having a drain coupled with the linear exponential transforming circuit to receive the exponential controlling signal; and
a fourth transistor having a source coupled with a source of the third transistor to generate the feedback signal at a drain of the fourth transistor, wherein the voltage controlling signal is generated at gates of the third transistor and the fourth transistor.

14. The variable gain amplifier according to claim 13, wherein the third transistor and the fourth transistor operate in saturation regions.

15. The variable gain amplifier according to claim 13, wherein the voltage buffer circuit further comprises:
a current source for generating the bias current;
a first current mirror, which is coupled with the current source to duplicate the bias current and transfer the duplicated bias current to the sources of the third transistor and the fourth transistor; and
a second current mirror, which is coupled with the current source to duplicate the bias current and transfer the duplicated bias current to the power transforming circuit.

16. The variable gain amplifier according to claim 15, wherein the power transforming circuit comprises:
a fifth transistor;
a sixth transistor having a drain coupled with a gate of the fifth transistor and a gate coupled with a source of the fifth transistor, wherein the exponential controlling signal and the feedback signal are respectively inputted to a drain of the fifth transistor and the drain of the sixth transistor, or the exponential controlling signal and the feedback signal are respectively inputted to the drain of the sixth transistor and the drain of the fifth transistor;
a seventh transistor having a gate coupled with the gate of the fifth transistor;
an eighth transistor having a drain coupled with a gate of the eighth transistor and a source of the seventh transistor to generate a power transforming signal; and
a third current mirror, which is coupled with the seventh transistor to duplicate the power transforming signal, is coupled with the second current mirror to add the duplicated power transforming signal and the bias current together to generate the power signal, and outputs the power signal to the linear exponential transforming circuit.

17. The variable gain amplifier according to claim 16, wherein the fifth transistor, the sixth transistor, the seventh transistor and the eighth transistor operate in sub-threshold regions.

18. The variable gain amplifier according to claim 16, wherein the power transforming signal is obtained by take two times of a square root of a product of the exponential controlling signal and the feedback signal.

* * * * *

UNITED STATES PATENT AND TRADEMARK OFFICE
CERTIFICATE OF CORRECTION

PATENT NO.         : 7,446,609 B2
APPLICATION NO.    : 11/707892
DATED              : November 4, 2008
INVENTOR(S)        : Wen-Chang Lee et al.

Page 1 of 1

It is certified that error appears in the above-identified patent and that said Letters Patent is hereby corrected as shown below:

Title Page; should read;
(22) Filed: February 20, 2007

Signed and Sealed this

Twenty-second Day of September, 2009

David J. Kappos
*Director of the United States Patent and Trademark Office*